United States Patent [19]

Mobley

[11] Patent Number: 4,766,333

[45] Date of Patent: Aug. 23, 1988

[54] CURRENT SENSING DIFFERENTIAL AMPLIFIER

[75] Inventor: Kenneth J. Mobley, Colorado Springs, Colo.

[73] Assignee: INMOS Corporation, Colorado Springs, Colo.

[21] Appl. No.: 23,184

[22] Filed: Mar. 9, 1987

[51] Int. Cl.$^4$ .............................................. H03K 5/24
[52] U.S. Cl. ................................. 307/530; 307/355; 307/494; 307/497; 330/253; 330/258
[58] Field of Search ............... 307/530, 355, 449, 494, 307/497; 330/258, 253

[56] References Cited

U.S. PATENT DOCUMENTS

| | | | |
|---|---|---|---|
| 3,656,003 | 4/1972 | Chen et al. | 307/530 |
| 3,876,887 | 4/1975 | Reed | 307/530 |
| 3,940,747 | 2/1976 | Kuo et al. | 307/449 |
| 4,150,311 | 4/1979 | Matsuda et al. | 307/530 |
| 4,250,412 | 2/1981 | Kung et al. | 307/530 |
| 4,355,377 | 10/1982 | Sud et al. | 307/449 |
| 4,468,628 | 8/1984 | Gross | 330/258 |
| 4,523,110 | 6/1985 | Johnson | 307/530 |

OTHER PUBLICATIONS

Millman, *MicroElectronics*, Sections 15-5, 15-6 (1979).
Calvert et al., *Electronics*, Sections 10.8, 10.9 (1978).
Glaser et al., *Integrated Circuit Engineering*, pp. 495-499, 508-511 (1979).

Primary Examiner—John Zazworsky
Attorney, Agent, or Firm—Edward D. Manzo

[57] ABSTRACT

An amplifier for a semiconductor circuit provides two circuit paths between VCC and ground, each including the source-drain path of a corresponding primary transistor. Two inpedances are coupled to respective inputs. The primary transistors are kept in saturation so that the voltage differential between the inputs is minimized but a large voltage differential is developed at outputs located along the two circuit paths. Also, a clamp circuit has a common node coupling the gate electrodes of the primary transistors together. Secondary transistors are included to mimic voltage changes on either input.

9 Claims, 5 Drawing Sheets

CURRENT SENSING DIFFERENTIAL AMPLIFIER

TECHNICAL FIELD

This invention is directed to sensing amplifiers for semiconductor memories and in particular to a differential amplifier which senses current for use in a low power static random access memory (SRAM).

BACKGROUND OF THE INVENTION

Semiconductor memories generally include an orthogonal array of memory cells for storing binary data in the form of ones and zeros. In static RAMS, usually each memory cell includes four or six transistors arranged in a cross-coupled flip-flop coupled to a pair of bit lines and a word line. The array typically includes columns of bit lines and rows of word lines. Customarily, the bit lines are grouped in pairs. A memory cell is located at each intersection of a bit line pair and a word line. A pair of bit lines can be selectively coupled to data lines under the control of one of a number of column select lines which originate from a column address decoder. Each of the word lines which originate from a row address decoder can selectively couple the memory cells in that row to their corresponding bit lines by turning on access transistors in the memory cell. Input addresses are decoded by the column address decoders and row address decoders to couple a particular memory cell, i.e., the memory cell located at the intersection of the selected bit lines and word lines, to the data lines. In this manner, binary data stored in the memory cells may be transferred to the bit lines and then to the data lines for eventual transfer to a memory output device Data is written into the memory cells in the same general manner. A good description of illustrative static RAM circuitry is provided in U.S. Pat. No. 4,355,377 owned by Inmos Corporation and entitled "Asynchronously Equilibrated And Pre-Charged Static RAM," the disclosure of which is incorporated hereby.

The data signal that is read out of a memory cell, whether of the type described supra or not, via the bit lines requires amplification before it can be used to drive the memory output device. This amplification is usually achieved in a number of stages, and the amplifiers used for this purpose are called sense amplifiers. Conventional sense amplifiers have sensed a voltage differential between the bit lines. The voltage difference typically developed between bit lines is on the order of 5% to 10% of the device supply voltage. Thus, for a 5 volt supply, the bit line voltage differential is in the 0.25 to 0.5 volt range.

One problem with sensing the voltage differential between the bit lines is that the bit lines and data lines are capacitively loaded. Accordingly, the generation of the required voltage differential involves a time delay. The time delay caused by the capacitance necessarily increases the time required to read data from a memory cell.

Another problem associated with existing voltage sensing techniques is that the voltage differential remaining on the bit line from a prior operation (reading or writing) may have to be reversed for the correct operation. For example, if one bit line is 0.5 volts below its companion bit line after data has been read from a first memory cell, the bit lines, upon reading the data from a second memory cell, may have to change so the first bit line is now 0.5 volts above its companion bit line. In order to increase the operating speed of the memory circuit, techniques have been developed to "equilibrate" or short together the bit lines so that the voltage differential remaining on the bits from a prior operation is eliminated. For example, U.S. Pat. No. 4,355,377 describes address transition detection circuitry coupled to a clock generator driving precharge and equilibration circuits. One disadvantage of these techniques is that the circuit is very sensitive to the timing of the signals used to control the equilibrating operation.

Further disadvantages of using sensing techniques which depend on the voltage differential between the bit lines are the difficulty in obtaining optimal signal gain from the sense amplifiers and in shifting the common mode voltage level on the bit lines before the differential signal can be used as a memory output signal. Both of these problems are caused by the fact that the bit lines must be maintained above a voltage equal to about 80% of the device supply voltage to preserve memory cell stability.

It is therefore an object of the present invention to provide sense amplifiers for a memory device in which the operating speed of the device is not adversely affected by the capacitance associated with the bit lines.

Another object of the invention is to provide a bit line equalization technique which does not depend upon critical timing signals.

It is a further object of the invention to provide sense amplifiers which have high gain and which simplify the task of level shifting the bit line differential signal to provide an output signal.

SUMMARY OF THE INVENTION

In accordance with these and other objects of the invention, the sense amplifiers of the present invention sense the differential current between input lines applied to the amplifier.

Preferably the differential current produces a differential voltage at the output of the amplifier. Due to the relative size of the components in the amplifier, the voltage differential created at the amplifier inputs is kept to a minimum. Preferably, a transistor coupling one input node to a corresponding output node is kept in saturation. Furthermore, the amplifier preferability is configured to act as an active voltage clamp. That is, when the voltage at a first input of the amplifier changes relative to a second input due to a differential input current, the amplifier forces the voltage at the second input to approach the voltage at the first input thereby to minimize any differential input voltage.

In accordance with a further aspect of the invention, the sense path for amplifying the data signal produced by a memory cell may include a first current sensing amplifier followed by a voltage sensing amplifier which is in turn followed by a second current sensing amplifier. The first and second current sensing amplifiers may be coupled to relatively long input lines, but because these amplifiers sense current, the capacitance associated with the long lines will not appreciably delay the development of an output signal. Furthermore, such an arrangement provides for easy amplification of the data signal read out of a memory cell and simplifies the task of level shifting the bit line differential signal to provide an output signal.

The present invention finds application in static RAMS, but is not limited thereto. Other semiconductor circuits can employ an amplifier according to tile present invention.

BRIEF DESCRIPTION OF THE DRAWINGS

In describing the preferred embodiment of the present invention, reference is made to accompanying drawings wherein.

DESCRIPTION OF THE PREFERRED EMBODIMENT

Figure 1:
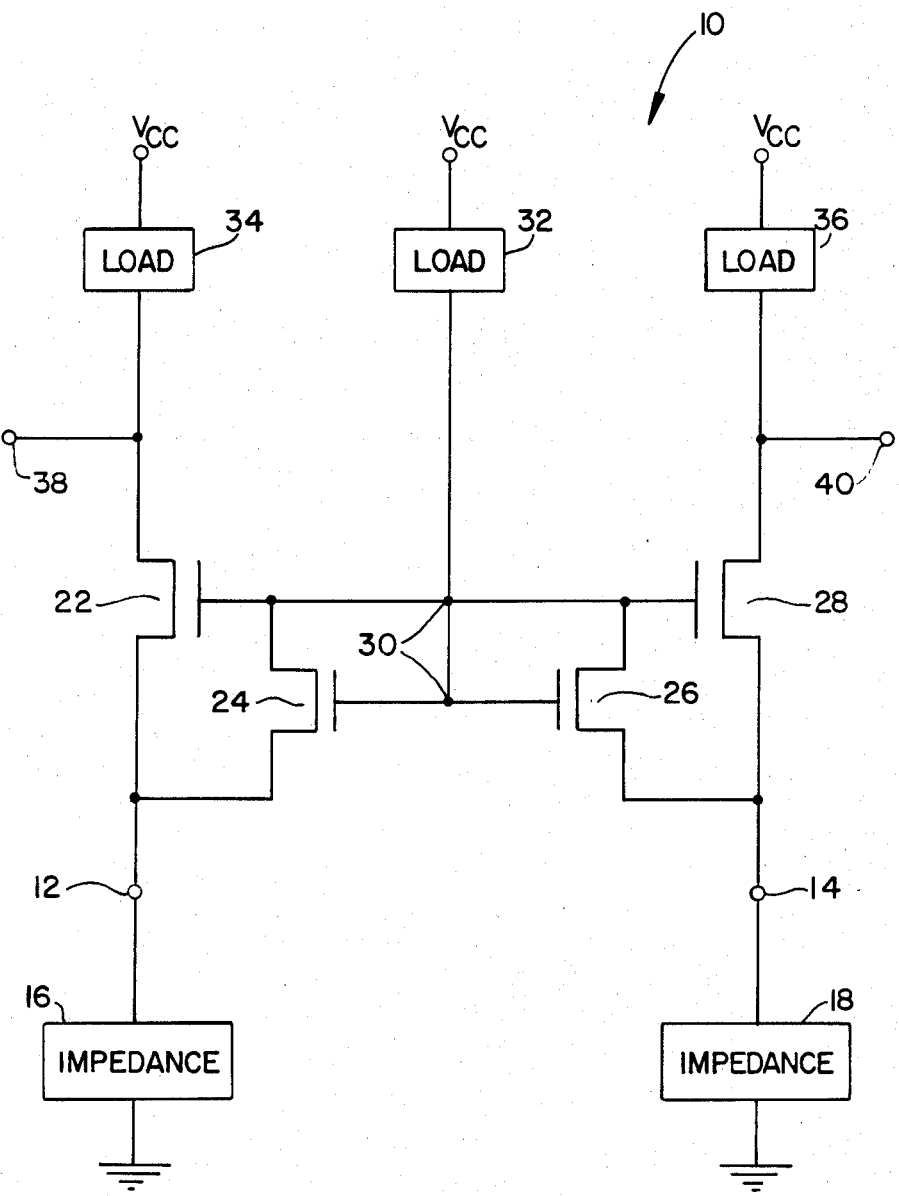
FIGS. 1 and 1A are simplified schematic diagrams of current sensing differential amplifiers according to some aspects of the present invention.
Figure 1A:
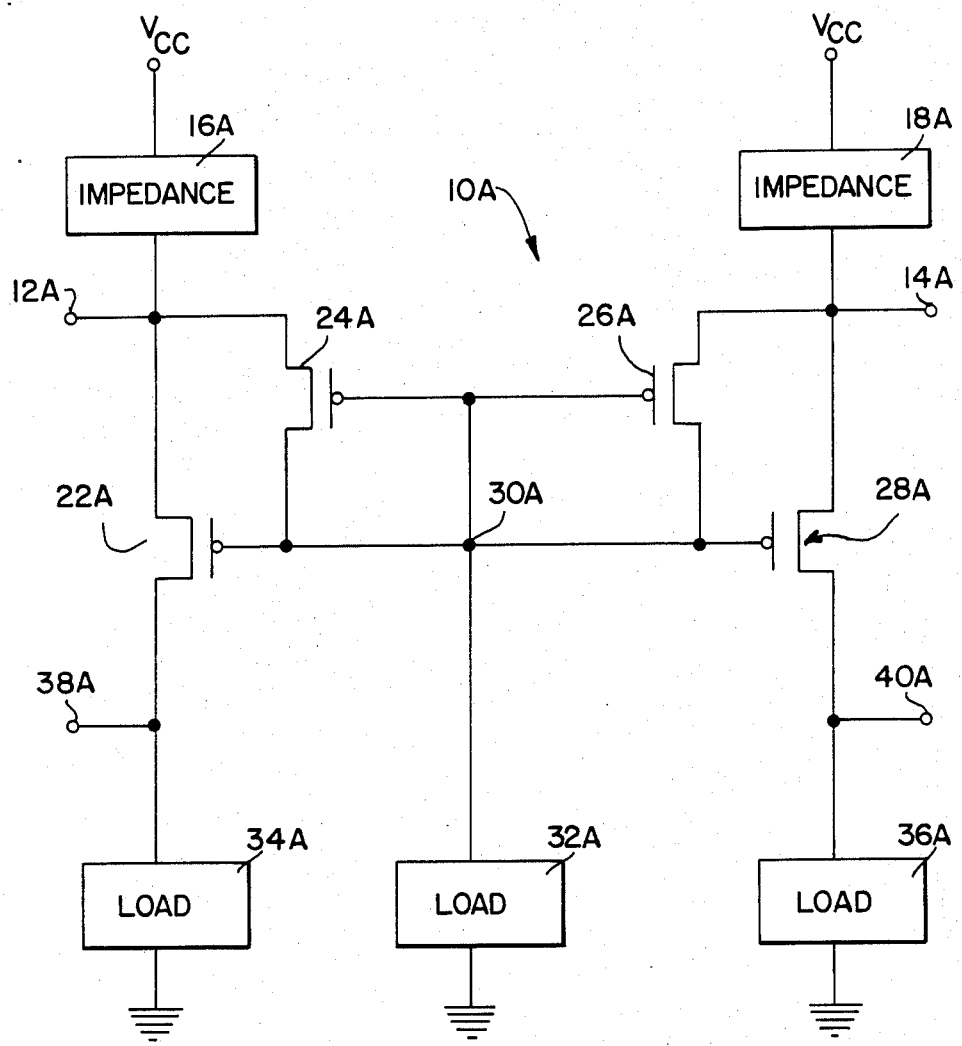

A simplified sense amplifier 10 according to the present invention is shown in FIG. 1. It will be understood that while n-channel MOS transistors of the enhancement type are generally referred to in FIG. 1, other types of transistors could be substituted. Indeed, FIG. 1A shows a corresponding amplifier 10A using p-channel MOS transistors. Amplifier 10 includes a first input terminal 12 and a second input terminal 14. Input terminals 12 and 14 are coupled to ground (a reference voltage) through impedances 16 and 18, respectively. Input terminal 12 is coupled to the sources of n-channel enhancement mode transistors 22 and 24. Input terminal 14 is coupled to the sources of n-channel transistors 26 and 28. The gates of transistors 22, 24, 26 and 28 and the drains of transistors 24 and 26 are connected to a common node 30. Node 30 is coupled to a supply voltage, VCC, through a load 32. The drain of transistor 22 is coupled to VCC through a load 34 and to a first output terminal 38. Likewise, the drain of transistor 28 is coupled to VCC througt a load 36 and to a second output terminal 40. Transistors 22 and 28 may be referred to as "primary input transistors" for amplifier 10. Transistors 24 and 26 may be referred to as "secondary input transistors."

Figure 3:
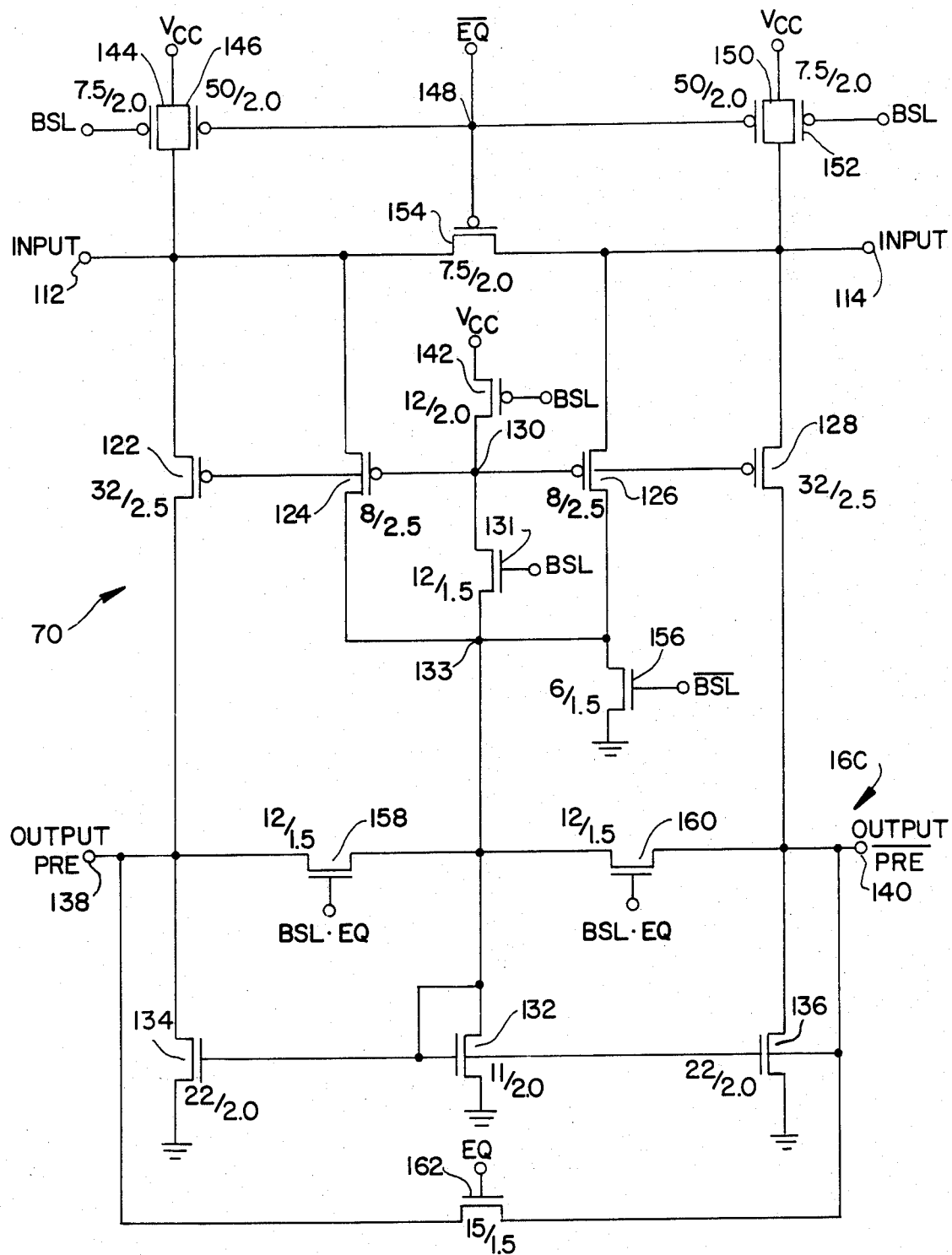
FIG. 3 is a schematic diagram of the pre-sense amplifier according to the present invention and generally shown in FIGS. 1A and 2.
Figure 4:
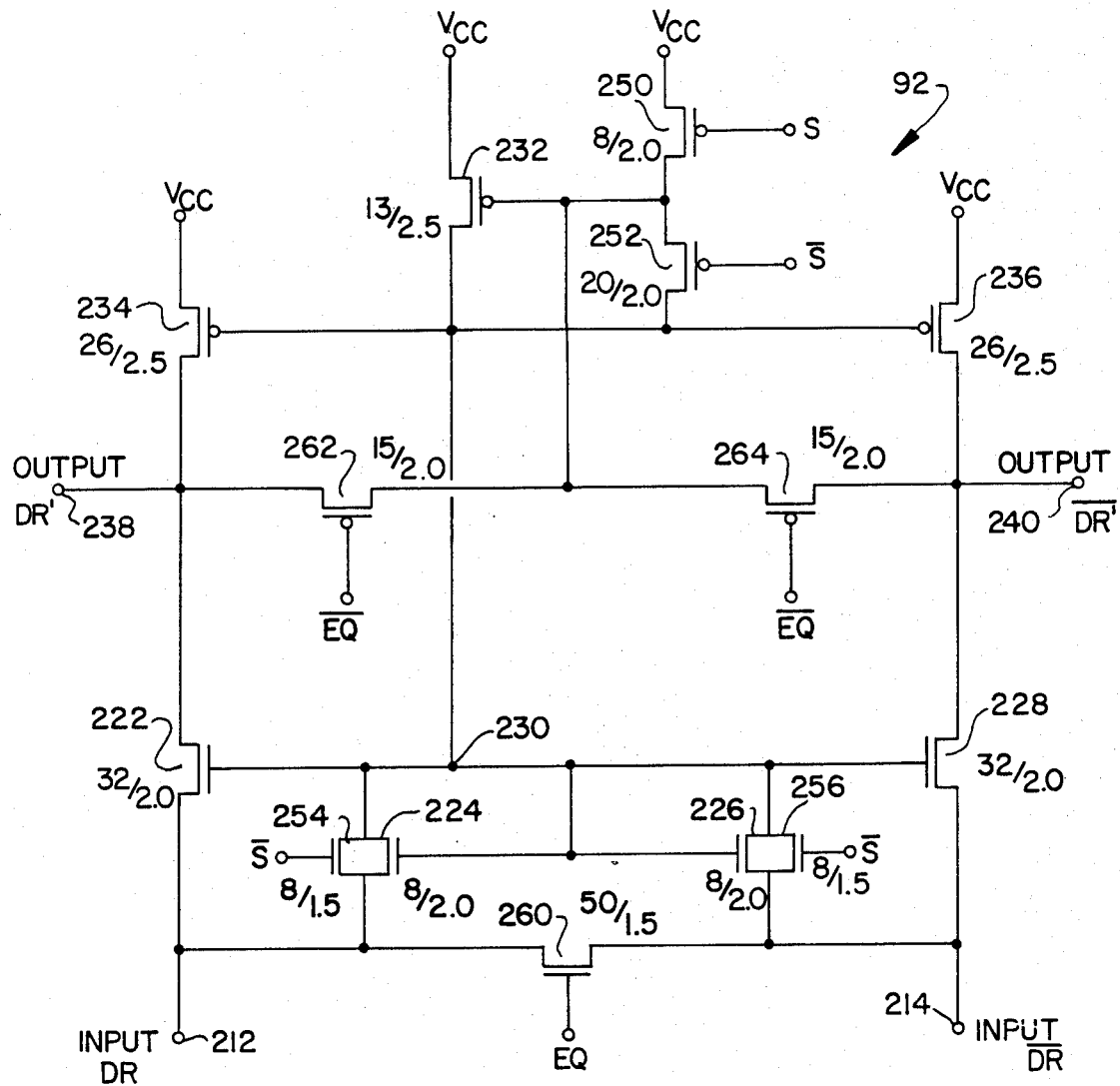
FIG. 4 is a schematic diagram of the main sense amplifier according to the present invention and generally shown in FIGS. 1 and 2.

The relative sizes of transistors 22 to 28 and loads 32 to 36 are important to the operation of the circuit 10, and illustrative dimensions for these transistors and loads are shown in FIGS. 3 and 4. In general, primary input transistors 22 and 28 are kept in saturation so that the current through them is essentially independent of the drain to source voltage. They are electrically identical and are large compared to secondary input transistors 24 and 26 so that the majority of the current drawn through transistors 22 to 28 is supplied by transistors 22 and 28. When impedances 16 and 18 become unequal in value preferably through accessing a memory cell or writing data, different currents will pass through input nodes 12 and 14. Transistors 22 and 28 are large enough in size to ensure that the voltage differential developed at the input nodes 12 and 14, due to the differential input current, will be minimal over the entire range of differential current expected on input nodes 12, 14.

The differing currents drawn through the source-drain paths of transistors 22 and 28 will cause a voltage differential to develop on output nodes 38 and 40. For a given current differential, the voltage differential is determined by the size of the loads 34 and 36 and the size of transistors 22 and 28 relative to transistors 24 and 26. Loads 34 and 36 are electrically symmetrical and are sized along with transistors 22 to 28 to allow the maximum voltage differential on the output nodes 38 and 40 without allowing transistors 22 and 28 to drop out of the saturation region (which would occur if the voltage on output node 38 or 40 were allowed to drop more than an n-channel threshold voltage below the voltage on node 30) under the maximum current differential expected at inputs 12, 14.

Secondary input transistors 24 and 26 are electrically identical and are sized along with load 32 such that node 30 is biased approximately one n-channel threshold voltage above the desired common-mode voltage on input nodes 12 and 14 over the entire range of common-mode currents expected on the input nodes. The common-mode input voltage can be adjusted by varying the size of load 32. Further, transistors 24 and 26 are sized along with load 32 such that the bias point of node 30 will recover at an adequate rate after a sudden change in input currents to ensure that circuit 10 will operate properly under non-equilibrium voltage conditions on input nodes 12 and 14. The recovery of the voltage on node 30 is discussed in more detail below.

When input nodes 12 and 14 are coupled to ground through impedances 16 and 18, current is drawn through primary and secondary input transistors 22 to 28. This current causes common node 30 and output nodes 38 and 40 to drop in voltage by an amount determined by their respective loads 32, 34 and 36. Because transistors 22 and 28 remain in the saturation region due to the appropriate sizing of transistors 22 and 28 relative to 24 and 26, and loads 34 and 36 relative to load 32, the voltage on output nodes 38 and 40 will have little effect on the voltage on the input nodes 12 and 14. Thus, the voltage on the input nodes 12 and 14 will be determined by the currents into the inputs 12 and 14, the sizes of transistors 22 and 28, and the voltage on node 30. If transistors 22, 28 are large, the voltage on nodes 12, 14 will be very nearly equal to the voltage on node 30 minus the threshold voltage of transistors 22 and 28. Thus, the differential input voltage will be minimized.

In operation, sense amplifier 10 produces a differential voltage on output nodes 38 and 40 on proportion to or in accordance with differential input current at input nodes 12 and 14. In FIG. 1, the differential input current is provided when impedances 16 and 18 become unequal in value. As will be explained below, when the circuit of FIG. 1 is used as a pre-sense amplifier, the differential input current is supplied via bit lines. When the circuit of FIG. 1 is used as a main sense amplifier, the differential input current is supplied by data read lines.

If impedance 16 is decreased relative to impedance 18, the current drawn through the source-drain paths of primary input transistors 22 and 24 will increase, and the voltage at input node 12 will drop in an amount necessary to supply the extra current. However, such voltage drop will be small because transistor 22 is preferably a large device. The extra current flow through transistor 22 will result in a voltage drop on output node 38 due to the presence of load 34. Thus, a voltage differential is developed on output nodes 38 and 40 due to the application of the differential input current at input nodes 12 and 14. As mentioned earlier, loads 34 and 36 are sized along with transistors 22 to 28 to allow the maximum voltage differential on output nodes 38 and 40 without allowing transistors 22 and 28 to drop out of the saturation region.

Furthermore, in accordance with another aspect of the invention, as the current through secondary input transistor 24 increases, the voltage on common node 30 will decrease. This decreases the voltage on the gates of transistors 26 and 28 and hence will cause the voltage at the sources of these transistors (i.e. at node 14) to decrease. Thus, a decrease in voltage on input node 12 will be mimicked by a decrease in voltage on node 30 and subsequently by a decrease in voltage on input node 14. In this manner, the long term voltage differential developed between the input nodes is further minimized. The time required for node 30 to recover to its normal bias point is a function of how much of the total current flowing out input nodes 12 and 14 is allowed to pass through secondary input transistors 24 and 26. This is determined by the ratio of the size of transistors 22 and 28 to the size of transistors 24 and 26.

If impedance 16 is increased relative to impedance 18, the amount of current drawn through transistors 22 and 24 will decrease. This causes a rise in the voltage level at output node 38 due to the presence of load 34 and a rise in the voltage level at node 30 which will again be mimicked by an increase in voltage at input node 14.

Because primary input transistors 22 and 28 are large compared to secondary input transistors 24 and 26, most of the current flowing through nodes 12 and 14 is supplied by transistors 22 and 28 and consequently by loads 34 and 36 (assuming negligible current is supplied through the outputs 38 and 40). Thus, the differential voltage on output nodes 38 and 40 will reflect the differential current on input nodes 12 and 14 in a manner determined by the loads 34 and 36. Since the voltage on the input nodes continues to be determined by the voltage on node 30, the output voltages will not affect the input voltages, and the voltage differential on the input nodes will remain small. Because there is a finite delay between the time when the input current changes and the time when node 30 and subsequently the opposite input node voltage become adjusted to equilibrium levels, the differential current through transistors 22 and 28 is amplified for the initial period of the output transition, thereby speeding up the reaction rate of the sensing circuit to a change in the differential current into the input nodes. Furthermore, because only small voltage differences are developed on the input nodes 12 and 14, the period of time required for the input voltages to adjust themselves to the proper voltage state (after a sudden change in differential input current signal states) is small for a given capacitance on input nodes 12 and 14.

Shown in FIG. 1A is the CMOS complementary version 10A of the simplified sense amplifier 10 according to the present invention. Amplifier 10A includes a first input terminal 12A and a second input terminal 14A. Input terminals 12A and 14A are coupled to VCC through impedances 16A and 18A, respectively. Input terminal 12A is coupled to the sources of p-channel transistors 22A and 24A. Input terminal 14A is coupled to the sources of p-channel transistors 26A and 28A. The gates of transistors 22A, 24A, 26A, and 28A and the drains of transistors 24A and 26A are connected to a common node 30A. Node 30A is coupled to ground through a load 32A. The drain of transistor 22A is coupled to ground through a load 34A, and to a first output terminal 38A. Likewise, the drain of transistor 28A is coupled to ground through a load 36A and to a second output terminal 40A.

The operation of sense amplifier 10A is identical to the operation of amplifier 10, except that amplifier 10A senses a differential impedance to VCC rather than sensing a differential impedance to ground. Thus, sense amplifier 10A produces a differential voltage on output nodes 38A and 40A in proportion to differential input current at input nodes 12A and 14A. In FIG. 1A, the differential input current is provided when impedances 16A and 18A become unequal in value. As will be explained below, when the circuit of FIG. 1A is used as a pre-sense amplifier, the differential input current is supplied by bit lines via data bus lines.

In conclusion, it will be understood that circuits 10 and 10A sense differences in current or impedance while minimizing voltage differential at their input nodes and thus develop a differential voltage at the outputs without a large differential voltage between the inputs.

Figure 2:
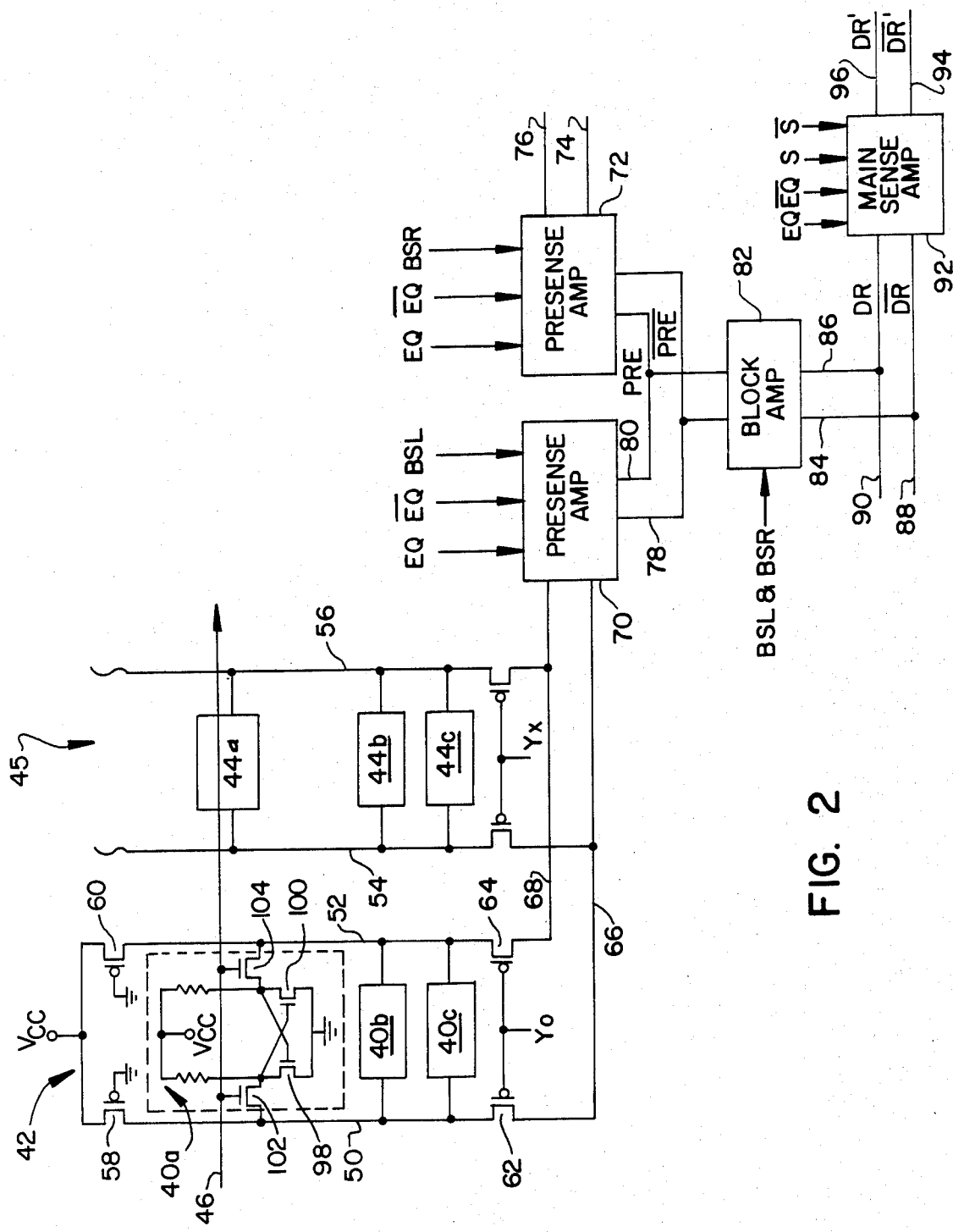
FIG. 2 is a block diagram illustrating a sense path for a static RAM in accordance with further aspects of the invention.

FIG. 2 illustrates two representative columns of memory cells coupled to an illustrative arrangement of sense amplifiers, according to further aspects of the present invention. Memory cells 40a, b, and c are shown in a first column 42. Memory cells 44a, b, and c are shown in a second column 45. Of these, only memory cell 40a is shown in full schematic diagram, the other memory cells having the same circuit. Illustratively, the memory cells are of the four-transistor type cooperating with a word line 46 and bit line pairs. Column 42 includes a complementary pair of bit lines 50, 52 whereas column 45 includes a complementary pair of bit lines 54, 56.

Bit lines 50, 52 and column 42 are coupled to a source of operating voltage, VCC, through the source-drain paths of p-channel transistors 58, 60. The bit line pairs of each column are similarly coupled to VCC through corresponding transistors. To access a memory cell in column 42, a signal Y° is brought low to turn on p-channel access transistors 62, 64 which couple bit lines 50, 52 respectively to data lines 66, 68. A corresponding pair of access transistors is gated by a signal Yx for column 45. It is convenient to organize the memory array into blocks of memory cells. Columns 42 and 45 are included in a left block selected by a signal BSL, and other columns (not shown) will be part of a right memory block selected by a signal BSR.

Data lines 66, 68 for the left block are coupled to a pre-sense amplifier 70. A further pre-sense amplifier 72 is coupled to data lines 74, 76 which, in the manner explained with regard to columns 42, 45, are coupled to bit line pairs through column access transistors gated by appropriate column select signals.

Each pre-sense amplifier 70, 72 provides complementary outputs PRE and PRE BAR on lines 78, 80 which are applied as inputs to a further amplifier 82 referred to as a "block amplifier." It will be understood that outputs 84, 86 of amplifier 82 correspond to the output for one major block of the memory array. Lines 84, 86 are coupled to further lines 88, 90 which are inputs to a main sense amplifier 92. It will be understood that amplifier 92 is coupled via lines 88, 90 to several block amplifiers such as amplifier 82. Amplifier 92 provides outputs on lines 94, 96 to output circuitry (not illustrated).

Parenthetically, it will be noted that pre-sense amplifier 70 includes other inputs including a signal BSL, whereas amplifier 72 includes an input signal BSR.

These are select signals which correspond to the selection of a left or right portion of a block. Amplifier 82 is activated by either signal BSL or BSR. These block select signals can be formed by combining a chip enable signal with address information. Alternatively, chip enable information can be used alone. Also shown are equilibration clock signals EQ and its complement applied to amplifiers 70, 72. These signals are used for equilibration within the amplifiers, and are based on sensing an address change. U.S. Pat. No. 4,355,377 discloses one way to develop such signals. Amplifier 92 receives select signals S and its complement. These are basically buffered chip enable signals.

Note that while each memory cell 40 and 44 illustratively is of the four-transistor flip-flop type, others can be used. In this example, a source of operating voltage (VCC) is coupled through resistive load devices to nodes coupled to ground through the source-drain paths of transfer transistors 98, 100. The gates of transfer transistors 98, 100 are cross-coupled to the nodes which are also coupled to access transistors 102, 104. The gate electrodes of the access transistors are couple to word line 46. Thus, when word line 46 goes high, the cells along the word line will be coupled to their bit lines. That is, cells 40a, 44a, and other cells (not shown) along word line 46 become coupled respectively to bit line pairs 50 and 52, 54 and 56, and others (not shown). With regard to cell 40a access transistors 102 and 104 turn on and couple bit lines 50, 52 to the nodes in the memory cell. The flip-flop formed therein will be in one of two stable states so that either transistor 98 will be on and transistor 100 will be off, or vice-versa. Whichever transfer transistor 98, 100 is on will couple a bit line via the access transistor to ground and reduce the amount of current supplied to data lines 66, 68 by transistor 58 or 60, whereas the other transfer transistor will not provide a path to ground for its corresponding bit line and thus will not reduce the amount of current supplied by (and thus increase the effective impedance to VCC of) its corresponding data line 66, 68. In this manner, the effective impedance to VCC of one of the data lines 66, is increased when the word line for the memory cell goes high.

Illustratively, each bit line can supply 275 microamperes of current to data lines 66, 68 (under a given common-mode voltage condition of the data lines). When a memory cell is accessed by its word line going high, one of the bit lines will supply about 155 microamperes of current, the remainder of the current being sunk by the cell. The other bit line will supply the full 275 microamperes. It will be understood that column access transistors 62 and 64 are turned on by signal Yo whereas signal Yx leaves the other illustrated column 45 not coupled to data lines 66, 68, whereby only one cell becomes coupled to data lines 66, 68.

When such a memory cell is accessed, the differential impedance between the bit lines and VCC is sensed by current sensing amplifier 70 which preferably is constructed generally in accordance with FIG. 1A. Thus, impedance 16A of FIG. 1A corresponds to the effective impedance of, collectively, the source-drain path of transistor 58, the bit line 50, the source-drain path of transistor 62, data line 66, the source-drain path of transistor 102 and the source-drain path of transistor 98. Impedance 18A of FIG. 1A corresponds in FIG. 2 to the impedances of transistor 60, bit line 52, transistor 64, data line 68, and transistors 100, 104.

Pre-sense amplifier 70 is preferably a currentsensing amplifier according to various aspects of the present invention which provides a differential voltage on its output lines 78, 80. Block amplifier 82 is illustratively of conventional type which senses the voltage differential on lines 78, 80 and provides corresponding currents on its output lines 84, 86. Main sense amplifier 92 is preferably a current-sensing amplifier according to the present invention which senses the different currents on its input lines 88, 90 and provides a relatively large voltage difference on its output lines 94, 96.

FIG. 3 illustrates a preferred form of the pre-sense amplifier 70 and uses p-channel MOS transistors extensively. It includes input nodes 112, 114 at the left and right sides of this schematic drawing. Input node 112 is coupled illustratively to data line 68 (FIG. 2) whereas input node 114 is coupled to data line 66. It will be noted that this circuit schematic diagram corresponds generally to that of FIG. 1A.

Thus, input node 112 is coupled to the source of a primary p-channel input transistor 122, which corresponds to transistor 22A in FIG. 1A. A further p-channel transistor 124 corresponds to transistor 24A. Further corresponding p-channel transistors 126 and 128 are coupled to input node 114 and correspond respectively to transistors 26A and 28A of FIG. 1A.

A node 130 corresponds to node 30A of FIG. 1A and in FIG. 3 is coupled to the gate electrodes of transistors 122, 124, 126 and 128. Node 130 is coupled through the source-drain path of a transistor 131 to a "load" comprising an n-channel transistor 132 having its source coupled to ground. Transistor 132 corresponds to load 32A of FIG. 1A.

Similarly, the drain of transistor 122 is coupled to a "load" comprising an n-channel transistor 134 having its source also coupled to ground. Further, the drain of transistor 128 is coupled to a "load" comprising an n-channel transistor 136 having its source coupled to ground. The gate electrodes of transistors 132, 134 and 136 are all coupled to a node 133 which is coupled to node 130 via the source-drain path of transistor 131 which is gated by a block select signal BSL. In this embodiment, current mirror loads are used, but other types of loads can be employed in specific applications of the invention.

Corresponding to output nodes 38A, 40A of FIG. 1A are output nodes 138 and 140 of FIG. 3. As can be seen, these are coupled to the drains of transistors 122 and 128, respectively. A p-channel transistor 142 couples node 130 to operating voltage, VCC, through its source-drain path and is gated by block select signal BSL. A further pair of transistors 144, 146 each have their source-drain paths coupling the input node 112 to VCC. These are p-channel transistors, and transistor 144 is gated by signal BSL, whereas transistor 146 is gated by a signal which is the logical complement of signal EQ, referred to herein as EQ BAR, via a node 148. Similarly, a pair of p-channel transistors 150, 152 couples VCC via the source-drain paths thereof to input node 114. The gate of transistor 150 is coupled to node 148, whereas the gate of transistor 152 is coupled to signal BSL.

An equilibrating p-channel transistor 154 is also gated by the signal at node 148 so that its source-drain path couples input nodes 112, 114 together.

An n-channel transistor 156 is gated by the signal which is the logical complement of signal BSL, referred to herein as BSL BAR, so that its source-drain path couples the drains of transistors 124, 126 and the source of transistor 131 to ground. In addition, the drain of transistor 156 is also coupled to output nodes 138, 140 via the source-drain paths of p-channel equilibration transistors 158, 160, both of which are gated by a logical AND of the signals BSL and EQ. Thus, it will be understood that when BSL is high, BSL BAR will be low and transistor 156 will release node 133 from ground. Further, the BSL high signal will couple node 130 to node 133 (through transistor 131) and to its "load" transistor 132. Further, transistors 144, 152 and 142 will release nodes 112, 114 and 130, respectively, from VCC so that the circuit will operate in the manner previously described.

Care has been given to establishing the transistor sizes for the circuit of FIG. 3, and for convenience those transistor sizes are preserved in FIG. 3. It will be seen that transistor 122 is four times larger than transistor 124, just as transistor 128 is four times larger than transistor 126. Since transistors 122 to 128 are all gated by node 130 and are all in the saturation region of operation, 0.8 of the current passing through node 112 will flow through transistor 122 and 0.2 of the current will flow through transistor 124. Because node 133 is coupled to both inputs, the current passing through load transistor 132 is 0.2 of the total current through both input nodes 112, 114 combined.

It will be observed that transistors 134 and 136 are equal size but that transistor 132 is only one-half the size of transistors 134, 136. When, as shown in FIG. 3, the primary input transistors 122, 128 are four times larger than secondary input transistors 124, 126 then if the currents into both inputs 112, 114 are equal, the voltages at nodes 138, 140 and 133 will be equal. This lets node 133 equilibrate to output nodes 138, 140 if it has been disturbed from its equilibrium potential by other signal activities (such as a disable or VCC bump).

As described with respect to FIG. 1A, the difference in currents applied to nodes 112, 114 results in a differential in voltage between output nodes 138 and 140 to reflect the difference in current between the input nodes 112 and 114.

Provision is made in FIG. 3 to equilibrate the outputs 138, 140. Transistors 158, 160, gated to a logic signal based on the block select signal BSL and the equilibration clock signal EQ (from, e.g., U.S. Pat. No. 4,355,377). As can be seen, the source-drain paths of these n-channel transistors equilibrates the outputs to node 133. A transistor 162 has its source-drain path coupling output node 138 to output node 140. Gated by the equilibration signal EQ, this assists in the equilibration step. Other specific circuits for equilibration can be substituted.

FIG. 4 illustrates the preferred embodiment of main sense amplifier 92. It will be understood that it corresponds generally with FIG. 1 and is a current sensing differential amplifier according to various aspects of the present invention. Thus, its inputs 212, 214 correspond to inputs 12, 14 of FIG. 1. An n-channel input transistor 222 is coupled to input node 212, and an input transistor 228 is coupled to input node 214. The gate electrodes of transistor 222 and 228 are coupled to a node 230. The source-drain path of a transistor 232 couples VCC to node 230. Similarly, the source-drain path of a transistor 234 couples VCC to the drain of transistor 222. The source-drain path of transistor 236 couples VCC to the drain of input transistor 228. An output node 238 is coupled between the drain of transistor 222 and the drain of its load transistor 234, and a second output node 240 is coupled between the drains of input transistor 228 and load transistor 236.

Transistor sizes have been left on FIG. 4 for convenience. It will be seen that the size of transistor 222 is four times the size of transistor 224. The relationship between transistors 228 and 226 is the same. This insures that the majority of input current is supplied via transistors 222 and 228.

Circuit 92 is enabled by applying a high signal S to the gate electrode of a p-channel transistor 250 and a low signal (S BAR) to the gate electrode of a p-channel transistor 252. The low S BAR signal is applied also to the gate electrodes of transistors 254, 256. Transistor 250 is therefore turned off and n-channel transistors 254, 256 are also turned off. Transistor 252 is turned on by the S BAR signal.

To prevent any false readings due to voltage differences remaining from previous operations involving different memory addresses, input nodes 212, 214 are equilibrated prior to a read operation following an address transition. This is achieved by applying an EQ signal to the gate electrode of a transistor 260 and its complement EQ BAR to the gate electrodes of transistors 262, 264. The EQ and EQ BAR pulses are single clock pulses of controlled duration produced by a clock generator initiated by an address transition detector of the sort described in the aforementioned U.S. Pat. No. 4,355,377. The high EQ signal turns on the n-channel transistor 260 whereas the low EQ BAR signals turn on transistors 262 and 264 whose source-drain paths couple input nodes 238 and 240 together.

The sizes of load transistors 232, 234 and 236 are chosen so that on zero equilibrium conditions, the potential at nodes 238, 240 and 230 should be the same. Node 230 is equilibrated to the output nodes 238, 240 in case it has been disturbed from its equilibrium potential by other signal activities such as a disable or a VCC bump. During the read operation itself, the EQ signal is low, and transistor 260 is off as are transistors 262 and 264.

In these embodiments, transistor sizes have been illustrated in ratios of four-to-one (primary vs. secondary input FETS) and two-to-one (loads). These can be varied within the scope of the present invention. Briefly, one decides how much of the bit line current will be used to generate the bias for the nodes. In FIG. 1, a 4:1 ratio (FET 22: FET 24 and FET 28:FET 26) means that one-fifth of the current goes to generate bias for the node 30 (130, 230), and determines how quickly this node recovers. After deciding how fast the bias on the node should recover, the current needed for this is determined and these ratios are established. Next, load 32 (132, 232) is sized to set the bias for the node voltage, given the common mode of the inputs. Then loads 34 and 36 (134, 136; 234, 236) are set to ensure that the primary transistors remain in saturation. All the FETS can then be scaled, if desired, but the bias node load may then need readjustment. In general, though, the primary input FETS are large compared to the secondary input FETS to ensure that the input node is an n-channel Vt below the bias node at all times.

It will be appreciated that the foregoing illustrative embodiment of the present invention can be varied within the scope of the invention which is defined by the following claims.

What is claimed is:

1. An amplifier for a semiconductor circuit comprising:
   first and second inputs;
   first and second outputs;
   first and second circuit paths each coupling a source of operating voltage to a reference voltage, said first circuit path being coupled to said first input and said first output, said second circuit path being coupled to said second input and said second output said first and second circuit paths including first and second transistors, said first transistor having its source-drain path coupled between said first input and said first output, said second transistor having its source-drain path coupled between said second input and said second output, said first and second transistors being matched; and
   a voltage clamp circuit coupling said first input to said second input and providing a common bias to the gate electrodes of said first and said second transistors.

2. The amplifier according to claim 1 wherein said voltage clamp circuit includes third and fourth matched transistors, a common node, and means coupling a source of operating voltage to said common node, said third transistor having its source drain path coupled between said first input and said source of operating voltage, said fourth transistor having its source-drain path coupled between said second input and said source of operating voltage, said common node being coupled to the gate electrodes of said third and fourth transistors.

3. The amplifier according to claim 2 wherein said common node is coupled to the gate electrodes of said first and second transistors, and wherein said third and fourth transistors are smaller than said first and second transistors.

4. The amplifier according to claim 1 wherein said first and second transistors are sized so that the voltage differential developed at said inputs, when different input impedances are coupled to said first and second inputs, is small over the range of differential current expected at said first and second inputs.

5. The amplifier of claim 4 wherein said circuit paths include a first load device in said first circuit path and a second load deivce in said second circuit path, said first and second load devices being matched in size with said first and second transistors to develop a voltage differential at said output nodes in response to differing impedances being coupled to said inputs.

6. The amplifier according to claim 1 wherein said first and second inputs are coupled to a pair of bit lines in a semiconductor memory.

7. A method for sensing the state of a memory cell comprising the steps of:
   developing different currents at two inputs of an amplifier based upon impedances related to the state of said memory cell;
   developing voltage transitions in said amplifier in accordance with said pair of currents;
   controlling voltages during said developing steps at said inputs to equalize; and
   developing differential voltages at two outputs based on said currents.

8. The method according to claim 7 further comprising sensing said differential voltages at said outputs to develop a further differential current, and amplifying said further differential current to provide further differential voltages.

9. The method of claim 7 wherein said method includes coupling first and second transistors in respective first and second circuit paths between a reference voltage and a source of operating voltage, maintaining said first and second transistors in saturation, said inputs being coupled to a selected one of the sources and the drains of said transistors, said differential voltages being developed at the other one of said sources and drains.

* * * * *